(12) United States Patent
Liu

(10) Patent No.: US 8,879,020 B2
(45) Date of Patent: Nov. 4, 2014

(54) DISPLAY DEVICE AND CUSHIONING MEMBER USABLE IN THE SAME

(75) Inventor: Hokshing Liu, Osaka (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 99 days.

(21) Appl. No.: 13/642,437

(22) PCT Filed: Mar. 9, 2011

(86) PCT No.: PCT/JP2011/055523
§ 371 (c)(1),
(2), (4) Date: Oct. 19, 2012

(87) PCT Pub. No.: WO2011/132473
PCT Pub. Date: Oct. 27, 2011

(65) Prior Publication Data
US 2013/0039021 A1 Feb. 14, 2013

(30) Foreign Application Priority Data
Apr. 22, 2010 (JP) ................................. 2010-099160

(51) Int. Cl.
*G02F 1/1333* (2006.01)
*H05K 9/00* (2006.01)

(52) U.S. Cl.
CPC ...... *G02F 1/133308* (2013.01); *G02F 2202/22* (2013.01); *H05K 9/0054* (2013.01); *H05K 9/0096* (2013.01); *G02F 2201/503* (2013.01)
USPC .......................................................... 349/58

(58) Field of Classification Search
None
See application file for complete search history.

(56) References Cited

U.S. PATENT DOCUMENTS

| 4,720,606 A | 1/1988 | Senn | |
|---|---|---|---|
| 2011/0051033 A1* | 3/2011 | Shimizu | .......................... 349/58 |
| 2011/0310545 A1 | 12/2011 | Liu | |

FOREIGN PATENT DOCUMENTS

| JP | 62-8597 | 1/1987 |
|---|---|---|
| JP | 11-143396 | 5/1999 |
| JP | 2000-13079 | 1/2000 |

(Continued)

OTHER PUBLICATIONS

International Search Report mailed May 24, 2011, directed to International Application No. PCT/JP2011/055523; 4 pages.

*Primary Examiner* — Thanh-Nhan P Nguyen
(74) *Attorney, Agent, or Firm* — Morrison & Foerster LLP

(57) ABSTRACT

An object of the present invention is to provide a display device including a cushioning member which is unlikely to be shifted from a predetermined position and has a function of effectively preventing EMI and/or ESD. In a display device according to the present invention, a cushioning member (50), located between a front surface of a peripheral portion (10b) of a display panel (10) and a back surface of a bezel facing the front surface, includes an elastic main body (52) formed of an elastic material and a conductive cover member (54) located on a surface of the elastic main body. At least a part of the conductive cover member is formed in a mesh pattern as a result of a plurality of conductive linear members (60) crossing each other and/or being located side by side. The cushioning member is structured such that in the state where the cushioning member is interposed between the front surface of the peripheral portion of the display panel and the back surface of the bezel, the elastic main body exposed in openings (70) of a part having the mesh pattern is contactable with the back surface of the bezel and/or the front surface of the peripheral portion of the display panel.

5 Claims, 6 Drawing Sheets

(56) References Cited

FOREIGN PATENT DOCUMENTS

| | | |
|---|---|---|
| JP | 2002-111270 | 4/2002 |
| JP | 2002-252478 | 9/2002 |
| JP | 2008-33093 | 2/2008 |
| WO | WO-2010/095310 | 8/2010 |

* cited by examiner

US 8,879,020 B2

DISPLAY DEVICE AND CUSHIONING MEMBER USABLE IN THE SAME

REFERENCE TO RELATED APPLICATIONS

This application is a national stage application under 35 USC 371 of International Application No. PCT/JP2011/055523, filed Mar. 9, 2011, which claims priority from Japanese Patent Application No. 2010-99160, filed Apr. 22, 2010, the entire contents of which are incorporated herein by reference.

FIELD OF THE INVENTION

The present invention relates to a display device including a display panel and a cushioning member (gasket) included in the display device and having a superb function of avoiding EMI and ESD.

BACKGROUND OF THE INVENTION

Recently, liquid crystal display devices including a typically rectangular liquid crystal display panel are in wide use as display devices of TVs, personal computers or the like.

Typically in this type of display device, a frame-like bezel is located on the front side of the display panel, and a frame having a frame-like shape is located on the back side of the panel. This bezel and the frame are each formed to have a frame-like shape surrounding a rectangular display area (active area) at a center of the display panel, and hold a peripheral portion of the rectangular panel on both of the front and rear sides of the display panel. Typically in such a display device, a cushioning member for cushioning a vibration-caused impact applied to the panel is located between a front surface of the display panel and a back surface of the bezel.

For electric devices such as the display devices as described above, measures are taken for preventing (reducing) generation of EMI (Electromagnetic Interference) and/or ESD (Electrostatic Discharge). For example, as the above-described cushioning member, a cushioning member (gasket) having a function as a conducting member against EMI and/or ESD in addition to having the original cushioning function has been proposed.

For example, Patent Document 1 describes a liquid crystal display device including a gasket located between a printed circuit board of a liquid crystal display panel and a metal shield frame (i.e., bezel) located on the front side of the panel. The gasket described in Patent Document 1 includes an insulating member and a conductive member located inner to the insulating member. A top surface and a bottom surface (two outer circumferential surfaces of the insulating member facing each other) of the gasket provided with a conductive cloth are in contact with the printed circuit board and the metal shield frame.

Patent Document 1: Japanese Patent Laid-Open Publication No. Hei 11-143396

SUMMARY OF THE INVENTION

However, the conductive cloth as described in Patent Document 1 has a small coefficient of friction at a surface thereof and thus is highly slippery. Therefore, when the gasket provided with such a conductive cloth is located between the metal shield frame (bezel) and the display panel, the gasket is shifted from the original position even by small vibration. When this occurs, the gasket may not function as a cushioning member or a conductive member. In order to fix (locate) such a gasket at a predetermined position of the rear surface of the shield frame (or the front surface of the display panel), the gasket needs to be pasted with a both-sided adhesive tape, an adhesive or the like. Addition of the step of fixing the gasket may raise the cost or decrease the work efficiency. Especially in the case where the gasket is fixed (bonded) to the display panel, it becomes difficult to detach the gasket from the panel for disassembling the display device, which is not preferable.

The present invention made in light of the above-described situation has a main object of providing a cushioning member (gasket) which is located between the display panel and the bezel located on the front side of the display panel to cushion a vibration-caused impact applied by vibration to the display panel, and is unlikely to be shifted easily from a predetermined position and also has a function of effectively preventing EMI and/or ESD. The present invention also has an object of providing a display device including such a cushioning member (gasket).

In order to realize the above-described object, the display device provided by the present invention includes a display panel; and a frame-like bezel attached to the display panel on a front side thereof so as to surround a peripheral portion of the panel. In the display device, a cushioning member (gasket) is located between a front surface of the peripheral portion of the display panel and a back surface of the bezel facing the front surface. The cushioning member includes an elastic main body formed of an elastic material and a conductive cover member located on a surface of the elastic main body. At least a part of the conductive cover member is formed in a mesh pattern as a result of a plurality of conductive linear members crossing each other and/or being located side by side. The cushioning member is structured such that in the state where the cushioning member is interposed between the front surface of the peripheral portion of the display panel and the back surface of the bezel, the elastic main body exposed in openings of a part having the mesh pattern is contactable with the back surface of the bezel and/or the front surface of the peripheral portion of the display panel.

In this specification, the term "mesh pattern" represents a generic concept of a state where a plurality of linear members cross each other and/or are located side by side so that spaces (openings) among the linear members are formed in which an elastic main body can be exposed, and encompasses a lattice pattern, a striped pattern, a spiral pattern and the like.

In this specification, the term "linear members" refers to lengthy strings, wires or other members which can form the mesh pattern. The linear members preferably have a circular or rectangular lateral cross-section, but are not limited to this.

With the display device according to the present invention, the cushioning member, located between the front surface of the peripheral portion of the display panel included in the display device and the back surface of the bezel included in the display device, includes an elastic main body. Owing to this, the cushioning member can exert the original cushioning function to cushion a vibration-caused impact applied to the display panel.

Typically, the surface of the elastic main body formed of an elastic material has a higher coefficient of friction than that of a surface of the conductive cover member (e.g., cover member formed of a conductive fiber material). At least a part of the conductive cover member (e.g., the surface facing the front surface of the peripheral portion of the liquid crystal display panel and/or the surface facing the back surface of the bezel) is formed of a plurality of conductive linear members crossing each other and/or being located side by side, so that the elastic main body is exposed in openings of the part having the mesh pattern (i.e., gaps among the linear members). Accordingly, in the state where the cushioning member is interposed between the front surface of the peripheral portion of the display panel and the back surface of the bezel, the elastic main body exposed in the openings of the part having the mesh pattern can contact the back surface of the bezel and/or the front surface of the peripheral portion of the display panel. Owing to this, a large frictional force acts on a contact part where the elastic main body and the front surface of the peripheral portion of the display panel contact each other, and/or a contact part where the elastic main body and the back surface of the bezel contact each other. As a result, the cushioning member is unlikely to be shifted from the predetermined position.

Since the cushioning member includes the conductive cover member located on the surface of the elastic main body, the display panel and the bezel (typically formed of a metal material) are electrically connected to each other via the conductive cover member. Owing to this, a conductive path is formed from the display panel to the bezel, and therefore EMI and/or ESD can be effectively prevented.

Therefore, the present invention realizes a preferable display device including the cushioning member which has the original cushioning function of cushioning a vibration-caused impact applied to the display panel, and is unlikely to be shifted from the predetermined position and also has a function of preventing EMI and/or ESD.

In a preferable embodiment of the display device disclosed herein, in an area of the peripheral portion of the display panel which is in contact with, or close to, the conductive cover member of the cushioning member interposed between the front surface of the peripheral portion and the back surface of the bezel, at least one electronic component is provided.

With the display device having such a structure, the electronic component is located (provided) at a position contacting or close to the conductive cover member (e.g., a plurality of linear members formed of a conductive material) of the cushioning member. Owing to this, for example, charges accumulated in the front surface of the display panel may flow to the bezel via the conductive cover member at a high probability. Therefore, the charges are prevented from flowing to the electronic component and thus the electronic component is prevented from being damaged with certainty. Accordingly, the display device having such a structure can exert the function of preventing EMI and/or ESD more effectively.

In a preferable embodiment of the display device disclosed herein, the conductive cover member is entirely formed in a mesh pattern.

With the display device having such a structure, the conductive cover member is entirely formed in a mesh pattern. Therefore, the elastic main body having a higher coefficient of friction than that of the surface of the conductive cover member contacts, in a larger area, the front surface of the peripheral portion of the display panel and the back surface of the bezel. Owing to this, the frictional force of the entirety of the contact part is increased, and thus the cushioning member can be prevented more effectively from being shifted from the position at which the cushioning member is originally located.

Since the conductive cover member is entirely formed in a mesh pattern, the cushioning member is located at such a position that the conductive cover member is in contact with (or at least close to) the electronic component. Thus, the cushioning member is usable without being restricted by the position of the electronic component.

In a preferable embodiment of the display device disclosed herein, a part of the conductive cover member, which is located in at least one of a surface of the cushioning member facing the back surface of the bezel and a surface of the cushioning member facing the front surface of the peripheral portion of the display panel, is formed in a mesh pattern; and a part of the conductive cover member, which is located in a side surface of the cushioning member facing the electronic component, is not formed in a mesh pattern and is formed so as to cover the elastic main body.

With the display device having such a structure, in a part of the conductive cover member having a mesh pattern, the cushioning member is prevented from being shifted owing to the elastic main body exposed in the openings of the part having the mesh pattern more effectively, and EMI and/or ESD is prevented owing to a conductive path being formed in the part having the mesh pattern more effectively. In addition, in the surface of the cushioning member contacting and/or close to the electronic component, the elastic main body is covered with the conductive cover member and is not exposed. Therefore, EMI and/or ESD can be prevented more effectively in this surface.

In another aspect, the present invention provides a cushioning member included in a display device disclosed herein. In the display device including a display panel and a frame-like bezel attached to the display panel on a front side thereof so as to surround a peripheral portion of the panel, the cushioning member is located between a front surface of the peripheral portion of the display panel and a back surface of the bezel facing the front surface. The cushioning member includes an elastic main body formed of an elastic material and a conductive cover member located on a surface of the elastic main body. At least a part of the conductive cover member is formed in a mesh pattern as a result of a plurality of conductive linear members crossing each other and/or being located side by side. The cushioning member is structured such that in the state where the cushioning member is interposed between the front surface of the peripheral portion of the display panel and the back surface of the bezel, the elastic main body exposed in openings of a part having the mesh pattern is contactable with the back surface of the bezel and/or the front surface of the peripheral portion of the display panel.

By use of the cushioning member for the display device according to the present invention, a preferable display device which has the original cushioning function of cushioning a vibration-caused impact applied to the display panel, and is unlikely to be shifted from the predetermined position and also has a function of preventing EMI and/or ESD is provided.

In a preferable embodiment of the cushioning member for a display device disclosed herein, the conductive cover member is entirely formed in a mesh pattern.

By use of the cushioning member for the display device having such a structure, a preferable display device which makes the cushioning member unlikely to be shifted from the predetermined position with more certainty and can prevent a plurality of electronic components from being damaged by EMI and/or ESD is provided.

In a preferable embodiment of the cushioning member for a display device disclosed herein, in the state where the cushioning member is interposed between the front surface of the peripheral portion of the display panel and the back surface of the bezel, a part of the conductive cover member, which is located in at least one of a surface of the cushioning member facing the back surface of the bezel and a surface of the cushioning member facing the front surface of the peripheral portion of the display panel, is formed in a mesh pattern; and a part of the conductive cover member, which is located in a side surface extending between the two surfaces of the cushioning member facing each other (typically, a surface extending in a longitudinal direction of the cushioning member), is not formed in a mesh pattern and is formed so as to cover the elastic main body.

By use of the cushioning member for the display device having such a structure, a preferable display device is provided which makes the cushioning member unlikely to be shifted from the predetermined position and can prevent the plurality of electronic components from being damaged by EMI and/or ESD because the part of the elastic main body covered with the conductive cover member (i.e., part of the elastic main body which is not exposed) is located in an area contacting or close to the electronic component.

DETAILED DESCRIPTION OF THE INVENTION

Figure 1:
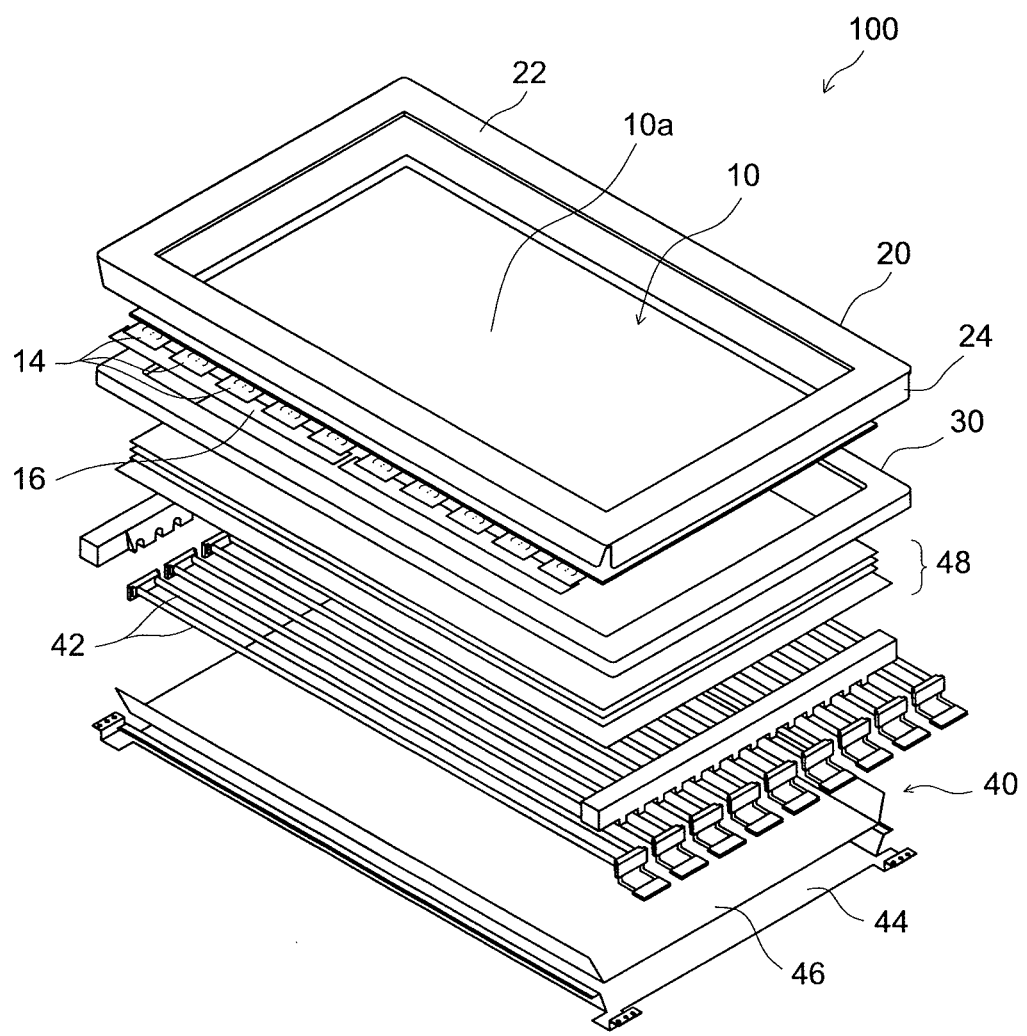
FIG. 1 is an exploded perspective view schematically showing a structure of a liquid crystal display device in an embodiment according to the present invention.

Hereinafter, several preferable embodiments of the present invention will be described with reference to the drawings. Elements which are other than elements specifically referred to in this specification (e.g., the structure of the bezel) and are necessary to carry out the present invention (e.g., the structure or production method of the liquid crystal display panel, the structure of the light source included in the liquid crystal display device, etc.) may be grasped as a matter of design choice for a person of ordinary skill in the art based on the conventional art. The present invention can be carried out based on the contents disclosed by this specification and the technological common knowledge in the art.

Hereinafter, with reference to FIG. 1 through FIG. 3, a display device in a preferable embodiment according to the present invention will be described. As an example, an active matrix type (TFT type) liquid crystal display device 100 including a liquid crystal display panel 10 as a display panel will be described. In the figures referred to below, members or portions having the same functions bear the same reference characters and descriptions thereof may not be repeated or may be simplified. In the figures, the relative sizes (length, width, thickness, etc.) do not necessarily reflect the actual relative sizes. In the following description, the "front surface", "top surface" or "frontal side" means the side of the liquid crystal display device 100 facing the viewer (i.e., the liquid crystal display panel side), and the "rear surface", "back surface" or "reverse side" means the side of the liquid crystal display device 100 not facing the viewer (i.e., the backlight unit 40 side).

Figure 2:
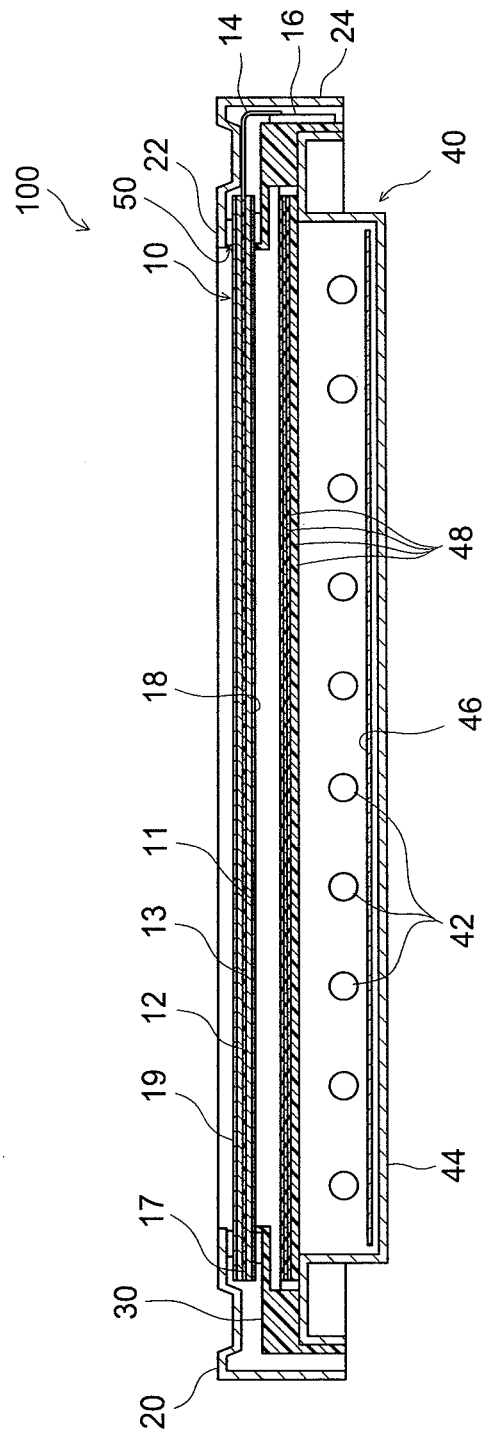
FIG. 2 is a cross-sectional view schematically showing the structure of the liquid crystal display device in the embodiment according to the present invention.

With reference to FIG. 1 and FIG. 2, a structure of the liquid crystal display device 100 will be described. As shown in FIG. 1, the liquid crystal display device 100 includes the liquid crystal display panel 10 and a backlight unit 40 as an external light source located on the reverse side (bottom side in FIG. 1) of the liquid crystal display panel 10. The liquid crystal display panel 10 and the backlight unit 40 are assembled to a bezel (frame) 20 and thus are integrally held.

As shown in FIG. 1 and FIG. 2, the liquid crystal panel 10 has a generally rectangular overall shape, and includes a display area 10a (see FIG. 1) which is an area having pixels formed in a central part thereof and provided for displaying an image. As shown in FIG. 2, the liquid crystal display panel 10 has a sandwich structure including a pair of light-transmissive glass substrates 11 and 12 facing each other and a liquid crystal layer 13 enclosed therebetween. Among the pair of light-transmissive glass substrates 11 and 12, the substrate located on the frontal side is a color filter substrate (CF substrate) 12, and the substrate located on the reverse side is an array substrate 11. A sealing member 17 is located along a peripheral portion of the glass substrates 11 and 12 so as to surround the display area 10a (see FIG. 1). The sealing member 17 seals the liquid crystal layer 13. The liquid crystal layer 13 is formed of a liquid crystal material containing liquid crystal molecules. When an electric field is applied between the glass substrates 11 and 12, an alignment of the liquid crystal molecules in the liquid crystal material is controlled and thus optical characteristics of the liquid crystal molecules are changed. On surfaces of the glass substrates 11 and 12 facing each other (inner surfaces), alignment films (not shown) for determining the alignment direction of the liquid crystal molecules are respectively formed. To surfaces of the glass substrates 11 and 12 not facing each other (outer surfaces), polarizer plates 18 and 19 are pasted.

The liquid crystal display panel 10 disclosed herein has the following structure. The array substrate 11 includes, on the frontal side thereof (side facing the liquid crystal layer 13), an array of pixels (not shown) for displaying an image, and a plurality of source lines (not shown) and a plurality of gate lines (not shown) arrayed in a lattice pattern, both of which are for driving the pixels (sub pixels). In each of lattice areas surrounded by these lines, a (sub) pixel electrode and a thin film transistor (TFT) as a switching element are provided. The pixel electrode is typically formed of ITO (Indium Tin Oxide), which is a transparent conductive material. The pixel electrodes are each supplied with a voltage in accordance with the image at a predetermined timing via the corresponding source line and the corresponding thin film transistor.

In the CF substrate 12, one of R (red), G (green) and B (blue) color filters (not shown) is provided in correspondence with, so as to face, each pixel electrode of the array substrate 11. The CF substrate 12 also includes a black matrix for demarcating the color filters of different colors from each other and a counter electrode (transparent electrode) uniformly formed on a surface of the color filters and the black matrix.

The array substrate 11 is formed to have a larger area size than that of the CF substrate 12. In the state where the two glass substrates 11 and 12 overlap each other, a peripheral portion 11a of at least one of four sides which form the periphery of the rectangular array substrate 11 slightly protrudes from the CF substrate 12 (see FIG. 3, FIG. 5 and FIG. 6). Along the protruding peripheral portion 11a, a plurality of flexible printed circuits (FPCs) 14 are provided side by side. The flexible printed circuits 14 each have a liquid crystal display panel driving IC chip (driver IC chip; not shown) mounted thereon for driving the liquid crystal display panel 10. Since one end of each of the flexible printed circuits 14 having such a structure is fixed to the protruding peripheral portion 11a, the flexible printed circuits 14 are connected to electrodes (above-described pixel electrodes, counter electrode, etc.) included in the liquid crystal display panel 10. The other end of each of the flexible printed circuits 14 is attached to a connection board 16, which is a printed circuit board (PCB) in which a controller for controlling the driver ICs (chips) and other electronic components are incorporated.

Figure 3:
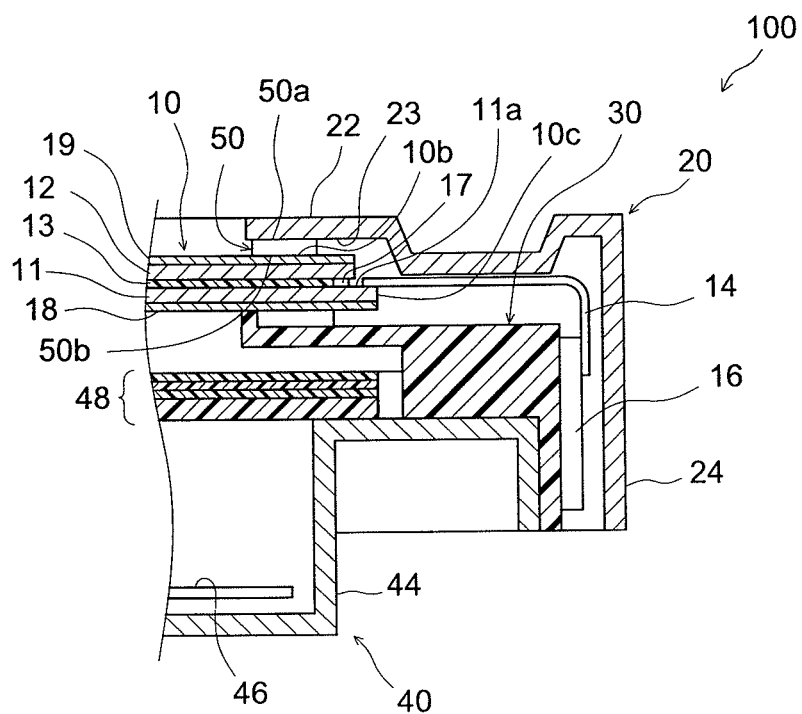
FIG. 3 is a cross-sectional view schematically showing a peripheral portion of a liquid crystal display panel of the liquid crystal display device in the embodiment according to the present invention.
Figure 5:
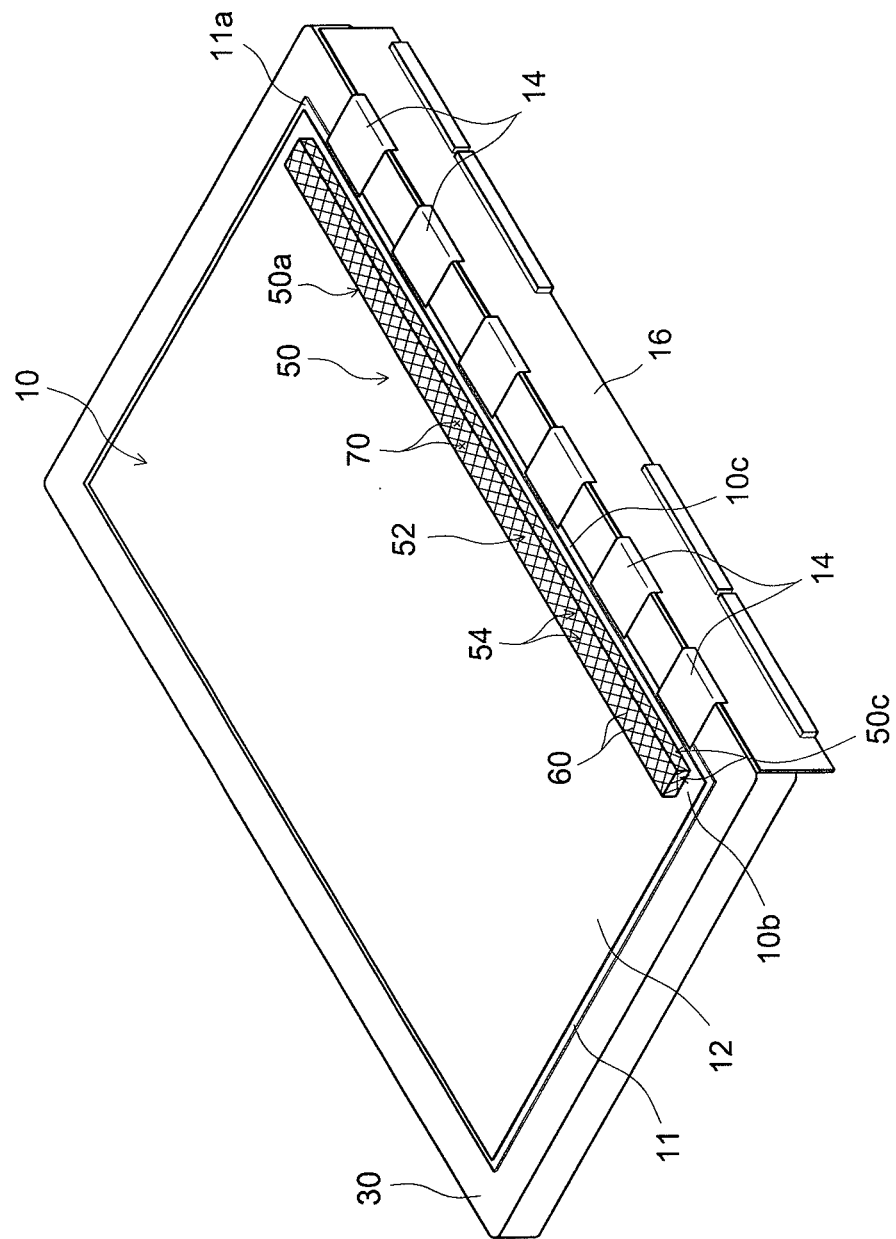
FIG. 5 is a perspective view schematically showing a state where the cushioning member in the embodiment is provided in an area of the peripheral portion of the liquid crystal display panel where electronic components are provided.

As shown in FIG. 3 and FIG. 5, the flexible printed circuits 14 of the liquid crystal display panel 10 in this embodiment are fixed to the peripheral portion 11a of one of the four sides which form the periphery of the rectangular array substrate 11 (i.e., peripheral edge 10c of the liquid crystal display panel 10). The location of the flexible printed circuits 14 along the periphery of the array substrate 11 is not limited. The liquid crystal display panel 10 may have the flexible printed circuits 14 along two sides or three sides among the four sides forming the periphery of the rectangular array substrate 11, or along all of the four sides thereof.

As shown in FIG. 3, the flexible printed circuits 14 attached to the peripheral portion of the liquid crystal display panel 10 (protruding peripheral portion 11a of the array substrate 11) are folded toward the backlight unit 40 described later. Thus, the connection board 16 is located on a side surface of the backlight unit 40 (more precisely, outer side surface of a frame 30). The connection board 16 may be located on the reverse side of the backlight unit 40.

The structure of the liquid crystal display panel 10 itself including the structures of the above-described pixels, electrodes, driving circuits and the like may be substantially the same as that of a conventional liquid crystal display panel and does not characterize the present invention, and thus will not be described in more detail.

As shown in FIG. 1 and FIG. 2, the backlight unit 40 located on the rear surface (reverse surface) of the liquid crystal display panel 10 includes a plurality of linear light sources (typically, cold-cathode fluorescent tubes, light emitting diodes, etc.) 42 and a case (chassis) 44 for accommodating the light sources 42. The case 44 has a box-like shape which is opened toward the frontal side. In the case 44, the light sources 42 are located parallel to each other. Between the case 44 and the light sources 42, a reflective member 46 for efficiently reflecting light from the light sources 42 toward the viewer is located.

In the opening of the case 44, a plurality of sheet-like optical members 48 are stacked and located so as to cover the opening. The optical members 48 are, for example, a diffuser, a diffusion sheet, a lens sheet and a luminance increasing sheet which are located sequentially in this order from the backlight unit 40 side toward the liquid crystal display panel 10 side. The optical members 48 are not limited to being this combination of elements or being located in this order. The case 44 is further provided with the frame 30 having a generally frame-like shape in order to hold the optical members 48 in the state where the optical members 48 are fit into the case 44. On the reverse side of the case 44, an inverter circuit substrate (not shown) on which an inverter circuit is mounted and an inverter transducer (not shown) as a booster circuit for supplying power to each of the light sources 42 are provided, but these elements do not characterize the present invention and thus will not be described in more detail.

As described above, the optical members 48 are located on the front side of the backlight unit 40. The frame 30 having an opening in an area corresponding to the display area 10a of the liquid crystal display panel 10 is attached to the front side of the optical members 48 so as to hold the optical members 48 together with the backlight unit 40. On the front surface of the frame 30, the liquid crystal display panel 10 is mounted. On the front side of the liquid crystal display panel 10, the bezel 20 is attached. The liquid crystal display panel 10 having such a structure is typically located between a back surface of a front frame 22 of the bezel 20 and the frame 30, and is held therebetween via a cushioning member 50 in this embodiment.

Figure 4:
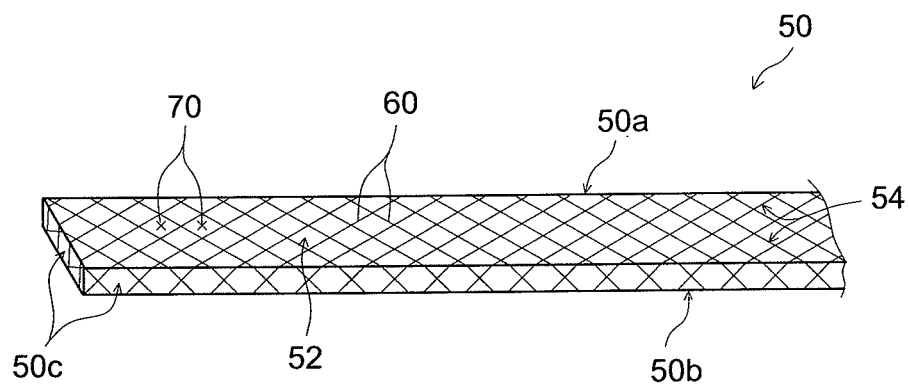
FIG. 4 is a perspective view schematically showing a structure of a cushioning member included in the liquid crystal display device in the embodiment according to the present invention.
Figure 6:
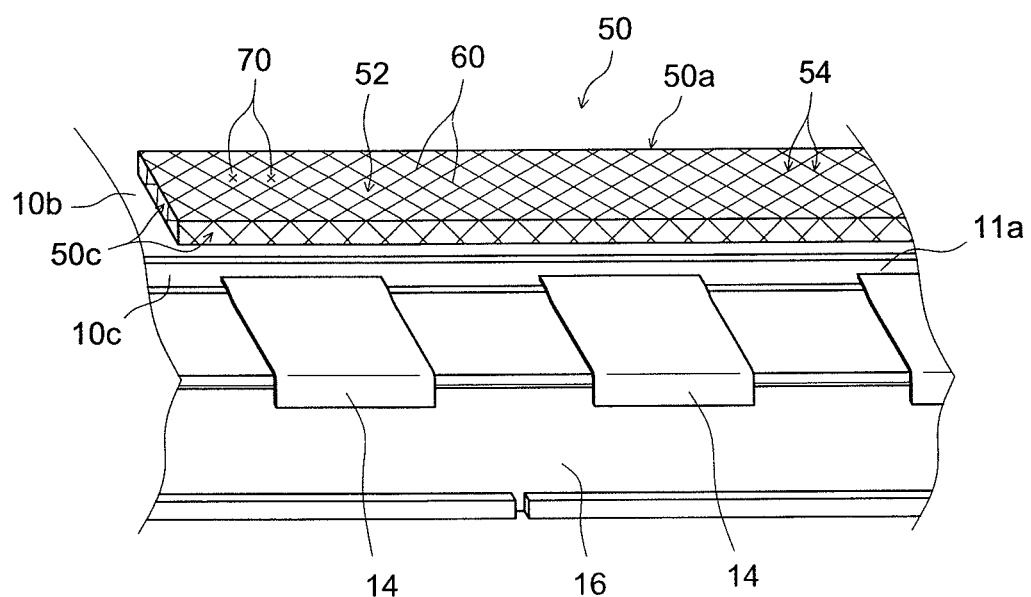
FIG. 6 is an enlarged perspective view of an important part of FIG. 5.

Now, with reference to FIG. 3 through FIG. 6, a structure and a location of the cushioning member 50 included in the liquid crystal display device 100 in this embodiment (first embodiment) will be described in detail. FIG. 3 is a cross-sectional view schematically showing the peripheral portion of the liquid crystal display panel 10 of the liquid crystal display device 100. FIG. 4 is a perspective view schematically showing a structure of the cushioning member 50 included in the liquid crystal display device 100. FIG. 5 is a perspective view schematically showing a state where the cushioning member 50 is located in an area of the peripheral portion of the liquid crystal display panel 10 where the electronic components (flexible printed circuits 14) are provided. FIG. 6 is an enlarged perspective view of an important part of FIG. 5. In FIG. 5, the number of the flexible printed circuits 14 located on the liquid crystal display panel 10 is decreased than that in FIG. 1 for the sake of simplicity.

As shown in FIG. 4, the cushioning member 50 in this embodiment includes an elastic main body 52 having, for example, a flat parallelepiped shape and formed of an elastic material and a conductive cover member 54 located on a surface of the elastic main body 52. Preferably, the elastic main body 52 is formed of an elastic material capable of exerting a cushioning function (i.e., capable of absorbing a vibration-caused impact) and having a high coefficient of friction against a material used to form the CF substrate 12 (typically, glass or a synthetic resin) and a metal material used to form the bezel 20. A preferable example of such an elastic material is urethane foam. As the urethane foam, the poron (registered trademark) material is preferably usable, for example.

The conductive cover member 54 is formed of a conductive material, and at least a part thereof (typically, a surface facing the front surface of the peripheral portion of the liquid crystal display panel 10 and/or a surface facing a back surface 23 of the bezel 20) is formed in a mesh pattern as a result of a plurality of linear members 60 formed of a conductive material crossing each other and/or being located side by side. As such a conductive material (linear members), any of various metal materials (e.g., iron (Fe), nickel (Ni), copper (Cu), etc.), any of carbon materials (carbon fiber, etc.) or the like is preferably usable, for example. A member, obtained by attaching (by coating) a conductive material (i.e., any of the above-described metal materials or carbon materials) to a surface of a member formed of a synthetic resin or the like by technique such as sputtering, plating or the like, may be used.

Specifically, as shown in FIG. 4, the cushioning member 50 in this embodiment is entirely formed in a mesh pattern as a result of the plurality of conductive linear members 60 crossing each other (i.e., the conductive cover member 54 is formed in a mesh pattern in all the surfaces of the cushioning member 50).

As shown in FIG. 3, the cushioning member 50 is located between the back surface 23 of the front frame 22 of the bezel 20 and a front surface (front peripheral portion) 10b of the peripheral portion of the liquid crystal display panel 10. As shown in FIG. 4, the cushioning member 50 located in this manner has the conductive cover member 54 formed in a mesh pattern in a frontal surface 50a of the cushioning member 50 facing the back surface 23 of the front frame 22 and in a reverse surface 50b of the cushioning member 50 facing the front peripheral portion 10b (typically, the both of the flat surfaces of the cushioning members 50), and further in side surfaces 50c of the cushioning member 50. In each of openings 70 of the mesh pattern (i.e., gaps among the plurality of linear members 60 crossing each other), the elastic main body 52 is exposed (the cover member 54 formed on the reverse surface 50b is not shown). The exposed elastic main body 52 has a height approximately equal to that of the conductive cover member 54, and thus the elastic main body 52 and the conductive cover member 54 form a flat plane. Especially preferably, the exposed elastic main body 52 is slightly risen from the conductive cover member 54. In the cushioning member 50, the conductive cover member 54 is located so as to tighten (press) the elastic main body 52, so that the elastic main body 52 having elasticity is formed to be risen outward from the openings 70 of the part having the mesh pattern of the conductive cover member 54.

As shown in FIG. 5, the cushioning member 50 in this embodiment has a length corresponding to the length of one side of the front peripheral portion (10b) (peripheral edge 10c) of the liquid crystal display panel 10. The conductive cover member 54 in a mesh pattern is located in the reverse surface 50b (see FIG. 4) of the cushioning member 50 facing the front peripheral portion 10b of the liquid crystal display panel 10, in the frontal surface 50a of the cushioning member 50 facing the back surface 23 of the front frame 22 of the bezel 20, and in the side surfaces 50c of the cushioning member 50. In the frontal surface 50a of the cushioning member 50, the conductive cover member 54 may not be formed so as to have the openings 70 by the plurality of linear members 60 (i.e., may not be formed in a mesh pattern) but may be formed to be sheet-like (i.e., in the form where the conductive cover member 54 covers the entirety of the frontal surface of the elastic main body 52 and thus the elastic main body 52 is not exposed on the frontal surface; hereinafter, "sheet-like" means the same form). There is no specific limitation on the size or the shape of the openings 70 (i.e., gaps among the linear members 60), but it is preferable that the surface area size of the conductive cover member 54 is large in order to provide a conductive path from the liquid crystal display panel 10 to the bezel 20 via the conductive cover member 54 with certainty.

Now, the location of the cushioning member 50 having the above-described structure will be described. Herein, a case where the cushioning member 50 is located on the front peripheral portion 10b on the peripheral edge 10c side of the liquid crystal display panel 10, on which the electronic components such as, for example, the flexible printed circuits 14 having the driver ICs are mounted will be described as an example. The location of the cushioning member 50 is not limited to the peripheral edge 10c side. The cushioning member 50 may be located along any of the four sides which form the peripheral edge of the liquid crystal display panel 10.

The bezel 20 for holding the cushioning member 50 may be substantially the same as the conventional bezel with no specific limitation. For example, as shown in FIG. 1, the bezel 20 is a frame-like component when seen in a plan view formed to surround the rectangular display area 10a at the center of the front surface of the liquid crystal display panel 10, and is typically a metal component. The bezel 20 having such a structure is fit to, and thus attached to, the liquid crystal display panel 10 so as to surround the front peripheral portion 10b of the liquid crystal display panel 10 as described above. The bezel 20 is structured so as to hold the liquid crystal display panel 10 integrally together with the backlight unit 40.

For the purpose of making the bezel 20 easier to be transported, reducing the material cost thereof or the like, the bezel 20 may be formed of four frame members having an L-shaped cross-section which are coupled to each other. Such a bezel 20 has a shape covering the front peripheral portion 10b of the liquid crystal display panel 10 and the peripheral edge of each side of the liquid crystal display panel 10 (among such peripheral edges, the peripheral edge along one side on which the flexible printed circuits 14 are provided is the peripheral edge 10c). As shown in FIG. 3, the bezel 20 includes the front frame 22 having a frame-like shape when seen in a plan view, which is located on the front peripheral portion 10b of the liquid crystal display panel 10. The bezel 20 includes a side frame 24 vertically extending from an outer peripheral edge of the peripheral portion 22 and located along the peripheral edge of the four sides including the peripheral edge 10c of the liquid crystal display panel 10.

As shown in FIG. 3, the cushioning member 50 is interposed between the back surface 23 of the front frame 22 of the bezel 20 having the above-described structure and the front peripheral portion 10b of the liquid crystal display panel 10. Preferably, the cushioning member 50 is located so as not to be exposed from an inner periphery of the front frame 22. In this state, the cushioning member 50 is located such that the reverse surface 50b of the cushioning member 50 faces, and is in contact with, the front peripheral portion 10b of the liquid crystal display panel 10, and such that the frontal surface 50a of the cushioning member 50 faces, and is in contact with, the back surface 23 of the front frame 22 of the bezel 20. Owing to this, the elastic main body 52 exposed in the openings 70 of the conductive cover member 54 in a mesh pattern is in contact with the front peripheral portion 10b of the liquid crystal display panel 10 and the back surface 23 of the front frame 22 of the bezel 20.

The frictional force acting on a contact part along with the elastic main body 52 exposed in the openings 70 of the conductive cover member 54 in a mesh pattern contacts the front peripheral portion 10b, and the frictional force acting on a contact part along which the exposed elastic main body 52 contacts the back surface 23 of the bezel 20, are respectively significantly larger than the frictional force acting on a contact part along which the conductive cover member 54 contacts the front peripheral portion 10b and a contact part along which the conductive cover member 54 contacts the back surface 23. Therefore, owing to the contact between the exposed elastic main body 52 and the front peripheral portion 10b of the liquid crystal display panel 10 and the contact between the exposed elastic main body 52 and the back surface 23 of the bezel 20, the cushioning member 50 is made unlikely to be shifted from the original position thereof, and thus can be kept located at a preferable position even after the liquid crystal display device 100 is transported or subjected to a vibration test.

In the case where the conductive cover member 54 is formed to be sheet-like instead of being in a mesh pattern in the frontal surface 50a of the cushioning member 50, the frontal surface 50a may be put into direct contact with the back surface 23 of the front frame 22 of the bezel 20. Alternatively, the cushioning member 50 may be bonded to the back surface 23 with a both-sided adhesive tape or the like to be fixed to the bezel 20. In the case where the cushioning member 50 is fixed to the bezel 20, the liquid crystal display panel 10 contacts the cushioning member 50 fixed to the bezel 20 as described above. Owing to this, the movement of the liquid crystal display panel 10 is effectively suppressed, which is preferable.

Since the cushioning member 50 is interposed between the back surface 23 of the front frame 22 of the bezel 20 and the front peripheral portion 10b of the liquid crystal display panel 10, the liquid crystal display panel 10 and the bezel 20 are electrically connected to each other via the conductive cover member 54 of the cushioning member 50. Thus, a preferable conductive path is formed from the liquid crystal display panel 10 to the bezel 20. Therefore, the cushioning member 50 can effectively prevent EMI and/or ESD.

As shown in FIG. 6, the cushioning member 50 in this embodiment includes the conductive cover member 54 formed in a mesh pattern in the frontal surface 50a, the reverse surface 50b (see FIG. 4) and the side surfaces 50c thereof. Therefore, when the cushioning member 50 is located at the above-described position, the conductive cover member 54 formed in a mesh pattern is in contact with, or close to, the flexible printed circuits 14 (electronic components including the flexible printed circuits 14). Owing to this, for example, charges accumulated in the liquid crystal display panel 10 flow in the conductive path from the liquid crystal display panel 10 to the bezel 20 via the conductive cover member 54 at a high probability. Thus, the possibility that the charges flow off course from the conductive path and flow to the drivers IC mounted on the flexible printed circuits 14 (and also to the connection board 16 connected to the flexible printed circuits 14) is very low. Accordingly, the electronic components including the flexible printed circuits 14 and the connection board 16 can be prevented with more certainty from being damaged by EMI or ESD.

A method for locating the cushioning member 50 described above may be substantially the same as the method for locating the conventional cushioning member on the reverse side of the conventional bezel (back surface of the front frame) with no specific limitation. According to one example, the frontal surface 50a of the cushioning member 50 is first located on (fixed to) the back surface 23 of the front frame 22, and then the bezel 20 provided with the cushioning member 50 is attached to the front surface of the liquid crystal display panel 10 (front peripheral portion 10b), which is located on the frame 30. In this manner, the cushioning member 50 can be interposed between the back surface 23 and the front peripheral portion 10b of the liquid crystal display panel 10. According to another example, as shown in FIG. 5, the liquid crystal display panel 10 is first located on the frame 30, and then the cushioning member 50 is located on (the front surface of) the front peripheral portion 10b of the liquid crystal display panel 10. Next, the bezel 20 is attached to the front side of the liquid crystal display panel 10.

In the manner described above, the cushioning member 50 which has the conventional cushioning function, and is unlikely to be shifted from the predetermined position and also has a function of preventing EMI and/or ESD can be located on the liquid crystal display panel 10.

Figure 7:
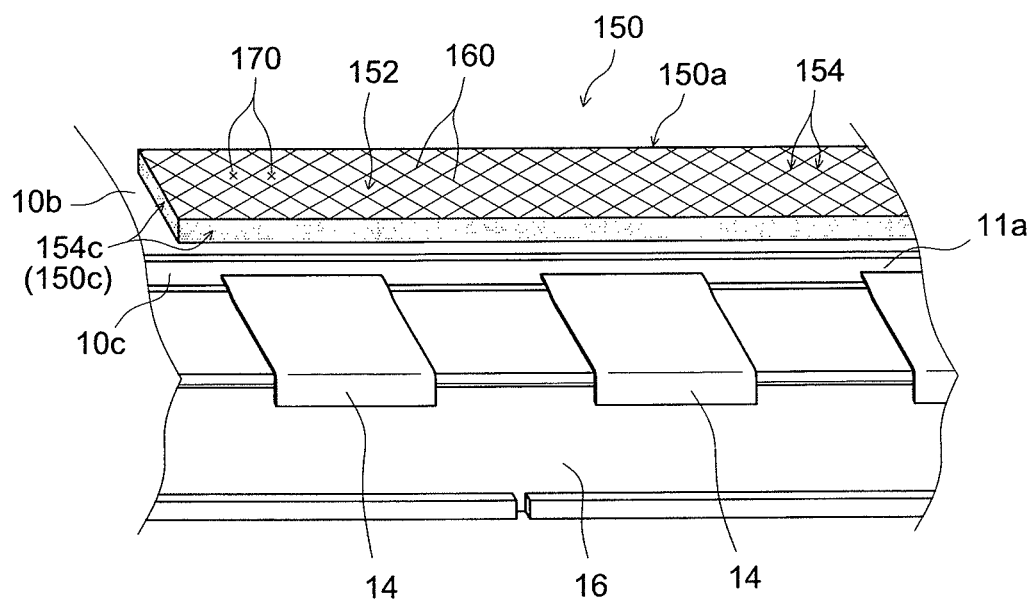
FIG. 7 is an enlarged perspective view of an important part schematically showing a state where a cushioning member in another embodiment is provided in an area of the peripheral portion of the liquid crystal display panel where the electronic components are provided.

The liquid crystal display device in the first embodiment described above uses the cushioning member 50 in which the conductive cover member 54 is entirely formed in a mesh pattern. The cushioning member is not limited to this. Hereinafter, a preferable embodiment of a cushioning member 150 in a second embodiment will be described with reference to FIG. 7. FIG. 7 is an enlarged perspective view of an important part schematically showing a state where the cushioning member 150 is provided in an area of the peripheral portion of the liquid crystal display panel 10 (see FIG. 5) where the electronic components (flexible printed circuits 14) are provided.

As shown in FIG. 7, the cushioning member 150 in this embodiment includes a conductive cover member 154 formed in a mesh pattern as a result of a plurality of linear members 160 crossing each other in a frontal surface 150a and in a reverse surface (not shown) of the cushioning member 150. An elastic main body 152 is exposed in openings 170 of the part having the mesh pattern. In side surfaces 150c of the cushioning member 150, the conductive cover member 154 is not formed in a mesh pattern and includes a conductive cover portion 154c formed to be sheet-like so as to cover the elastic main body 152. In the side surfaces 150c of the cushioning member 150 having such a structure, the elastic main body 152 is covered with the conductive cover portion 154c and is not exposed. Therefore, a conductive path is formed with certainty from the liquid crystal display panel 10 to the bezel 20 via the conductive cover member 154.

The conductive cover portion 154c may be formed of substantially the same material as that of the linear members 60 in the first embodiment described above. For example, the conductive cover portion 154c may be preferably formed of a sheet-like conductive material, or a conductive cloth (conductive fiber) formed of a resin material (fabric, non-woven fabric or knit item) provided (e.g., plated) with a metal material (e.g., copper or nickel), which can cover the elastic main body 152.

In the above embodiments, the entirety of, or a part of, the conductive cover member is formed in a mesh pattern. The cushioning member is not limited to this.

Figure 8:
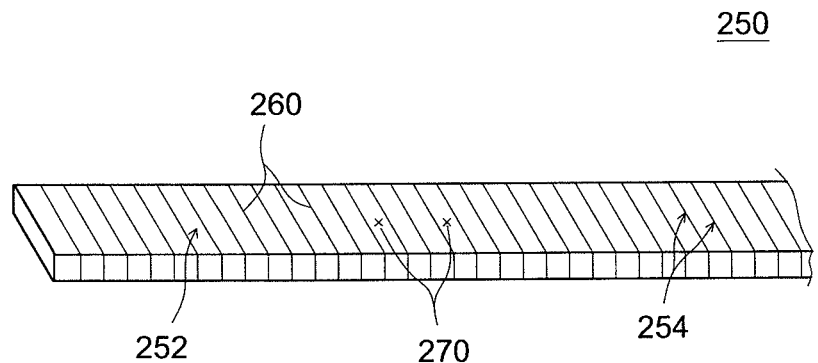
FIG. 8 is a perspective view schematically showing a structure of a cushioning member included in a liquid crystal display device in still another embodiment according to the present invention.

As shown in FIG. 8, in a third embodiment, a cushioning member 250 includes a conductive cover member 254 formed in a striped pattern as a result of a plurality of linear members 260 formed of a conductive material being located side by side. An elastic main body 252 is exposed in openings 270 of the part having the striped pattern (gaps among the linear members 260). Owing to this structure, substantially the same effect as that of the first embodiment is provided.

Figure 9:
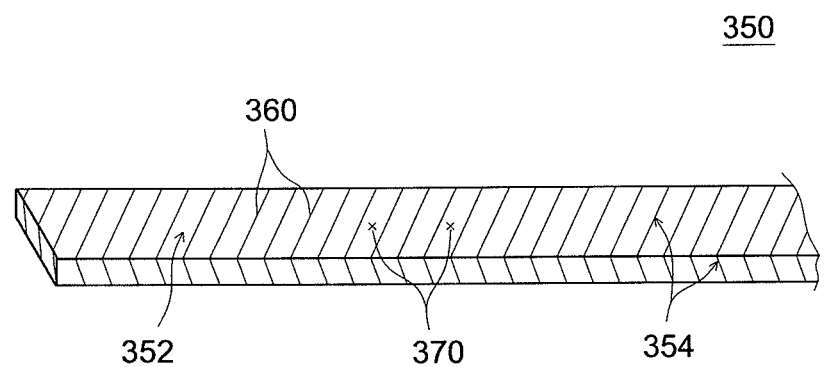
FIG. 9 is a perspective view schematically showing a structure of a cushioning member included in a liquid crystal display device in still another embodiment according to the present invention.

As shown in FIG. 9, in a fourth embodiment, a cushioning member 350 includes a conductive cover member 354 formed in a spiral pattern as a result of a plurality of linear members 360 formed of a conductive material being located side by side. An elastic main body 352 is exposed in openings 370 of the part having the spiral pattern (gaps among the linear members 360). Owing to this structure, substantially the same effect as that of the first embodiment is provided. In the third and fourth embodiments, in the side surfaces of the cushioning member, the conductive cover member may be formed to be sheet-like as in the second embodiment. In this case, substantially the same effect as that of the second embodiment is provided.

The present invention has been described by way of preferable embodiments. The above description is not limiting the present invention, and various modifications can be made, needless to say. For example, in the above embodiments, the cushioning member 50 has a length approximately equal to the length of the peripheral edge 10c (front peripheral portion 10b) of the liquid crystal display panel 10 and one cushioning member 50 is located along the peripheral edge 10c (front peripheral portion 10b) of one side. Alternatively a plurality of cushioning members may be located along the peripheral edge 10c (front peripheral portion 10b) of one side.

According to the present invention, a preferable display device including a cushioning member which has the original cushioning function of cushioning a vibration-caused impact applied to a display panel, and is unlikely to be shifted from a predetermined position and also has a function of preventing EMI and/or ESD is provided.

The invention claimed is:

1. A display device, comprising:
   a display panel; and
   a frame-like bezel attached to the display panel on a front side thereof so as to surround a peripheral portion of the panel;
   wherein:
   a cushioning member is located between a front surface of the peripheral portion of the display panel and a back surface of the bezel facing the front surface;
   the cushioning member includes an elastic main body formed of an elastic material and a conductive cover member located on a surface of the elastic main body;
   at least a part of the conductive cover member is formed in a mesh pattern as a result of a plurality of conductive linear members crossing each other and/or being located side by side; and
   the cushioning member is structured such that in the state where the cushioning member is interposed between the front surface of the peripheral portion of the display panel and the back surface of the bezel, the elastic main body exposed in openings of a part having the mesh pattern is contactable with the back surface of the bezel and/or the front surface of the peripheral portion of the display panel,
   wherein in an area of the peripheral portion of the display panel which is in contact with, or close to, the conductive cover member of the cushioning member interposed between the front surface of the peripheral portion and the back surface of the bezel, at least one electronic component is provided.

2. The display device of claim 1, wherein the conductive cover member is entirely formed in a mesh pattern.

3. The display device of claim 1, wherein a part of the conductive cover member, which is located in at least one of a surface of the cushioning member facing the back surface of the bezel and a surface of the cushioning member facing the front surface of the peripheral portion of the display panel, is formed in a mesh pattern; and a part of the conductive cover member, which is located in a side surface of the cushioning member facing the electronic component, is not formed in a mesh pattern and is formed so as to cover the elastic main body.

4. A cushioning member for a display device, which is included in the display device including a display panel and a frame-like bezel attached to the display panel on a front side thereof so as to surround a peripheral portion of the panel, the cushioning member being located between a front surface of peripheral portion of the display panel and a back surface of the bezel facing the front surface, wherein:
   the cushioning member includes an elastic main body formed of an elastic material and a conductive cover member located on a surface of the elastic main body;
   at least a part of the conductive cover member is formed in a mesh pattern as a result of a plurality of conductive linear members crossing each other and/or being located side by side; and
   the cushioning member is structured such that in the state where the cushioning member is interposed between the front surface of the peripheral portion of the display panel and the back surface of the bezel, the elastic main body exposed in openings of a part having the mesh pattern is contactable with the back surface of the bezel and/or the front surface of the peripheral portion of the display panel,
   wherein in the state where the cushioning member is interposed between the front surface of the peripheral portion of the display panel and the back surface of the bezel, a part of the conductive cover member, which is located in at least one of a surface of the cushioning member facing the back surface of the bezel and a surface of the cushioning member facing the front surface of the peripheral portion of the display panel, is formed in a mesh pattern; and a part of the conductive cover member, which is located in a side surface extending between the two surfaces of the cushioning member facing each other, is not formed in a mesh pattern and is formed so as to cover the elastic main body.

5. The cushioning member for a display device of claim 4, wherein the conductive cover member is entirely formed in a mesh pattern.

* * * * *